(12) United States Patent
Matsumoto et al.

(10) Patent No.: US 7,427,901 B2
(45) Date of Patent: Sep. 23, 2008

(54) OSCILLATOR ARRAY, AND SYNCHRONIZATION METHOD OF THE SAME

(75) Inventors: Hiroshi Matsumoto, Kyoto (JP); Naoki Shinohara, Kyoto (JP)

(73) Assignee: Kyoto University, Kyoto (JP)

( * ) Notice: Subject to any disclaimer, the term of this patent is extended or adjusted under 35 U.S.C. 154(b) by 111 days.

(21) Appl. No.: 10/586,644

(22) PCT Filed: Jan. 24, 2005

(86) PCT No.: PCT/JP2005/000829

§ 371 (c)(1),
(2), (4) Date: Jul. 19, 2006

(87) PCT Pub. No.: WO2005/071841

PCT Pub. Date: Aug. 4, 2005

(65) Prior Publication Data

US 2007/0188241 A1    Aug. 16, 2007

(30) Foreign Application Priority Data

Jan. 22, 2004  (JP) .............................. 2004-014580

(51) Int. Cl.
H03B 27/00 (2006.01)
(52) U.S. Cl. ................ 331/46; 331/2; 331/47; 331/50; 331/55
(58) Field of Classification Search ............ 331/2, 331/46, 47, 50, 55
See application file for complete search history.

(56) References Cited

U.S. PATENT DOCUMENTS 3,555,447 A   1/1971   Bonfeld et al.

(Continued)

FOREIGN PATENT DOCUMENTS

JP     49-006866 A    1/1974

(Continued)

OTHER PUBLICATIONS

Stephan, K. D., "Inter-Injection-Locked Oscillators with Applications to Spatial Power Combining and Phased Arrays", *Microwave Symposium Digest*, MTT-S International, vol. 86, No. 1, Jun. 2, 1986, pp. 159-162, XP002469255.

(Continued)

*Primary Examiner*—Arnold Kinkead
(74) *Attorney, Agent, or Firm*—Young & Thompson

(57) ABSTRACT

Signals outputted from oscillators ($1$-$1$, $1$-$2$, . . . $1$-$n$) are in phase with signals as reflected by band elimination filters ($3$-$1$, $3$-$2$, . . . $3$-$n$) at elimination frequencies of the band elimination filters ($3$-$1$, $3$-$2$, . . . $3$-$n$), while they are in opposite phase with signals leaked from the corresponding band elimination filters ($3$-$1$, $3$-$2$, . . . $3$-$n$). In this way, a stable oscillation can be performed with the oscillation frequencies of the oscillators ($1$-$1$, $1$-$2$, . . . $1$-$n$) balanced as optimum frequencies between the natural frequencies of the oscillators ($1$-$1$, $1$-$2$, . . . $1$-$n$) and the elimination frequencies of the band elimination filters ($3$-$1$, $3$-$2$, . . . $3$-$n$), while the oscillators ($1$-$1$, $1$-$2$, . . . $1$-$n$) can be synchronized with the elimination frequencies being used as reference frequencies.

3 Claims, 3 Drawing Sheets

U.S. PATENT DOCUMENTS 5,152,005 A * 9/1992 Bickley ........................ 455/76

FOREIGN PATENT DOCUMENTS

| JP | 2002-299943 | 10/2002 |
| JP | 2002-299943 A | 10/2002 |
| JP | 2003-133952 | 5/2003 |
| JP | 2003-258556 | 9/2003 |

OTHER PUBLICATIONS

York, R. A. et al., "Injection- And Phase-Locking Techniques for Beam Control", *IEEE Transactions on Microwave Theory and Techniques*, IEEE Service Center, Piscataway, NJ, vol. 46, No. 11, Part 2, Nov. 1998, pp. 1920-1929, XP000785381.

* cited by examiner

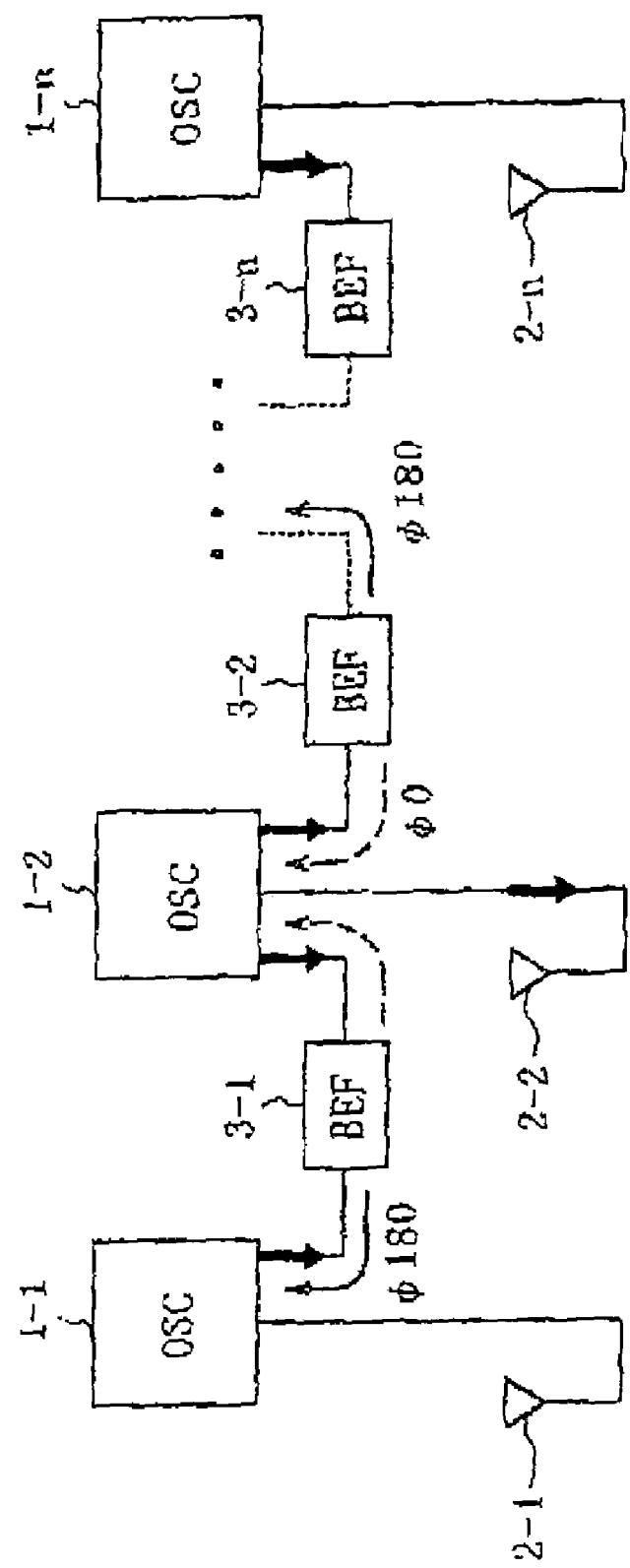
[FIG. 1]

[FIG. 2]
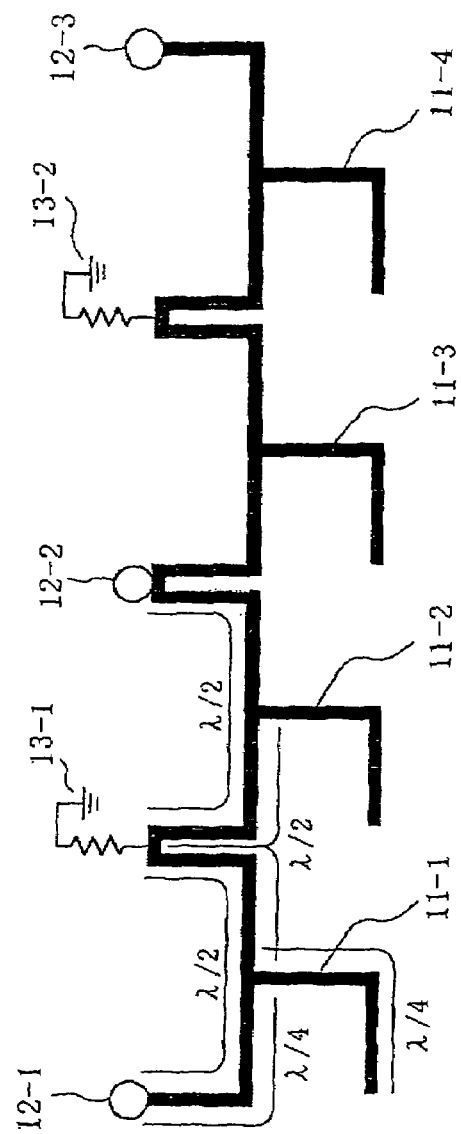
[FIG. 3] PRIOR ART
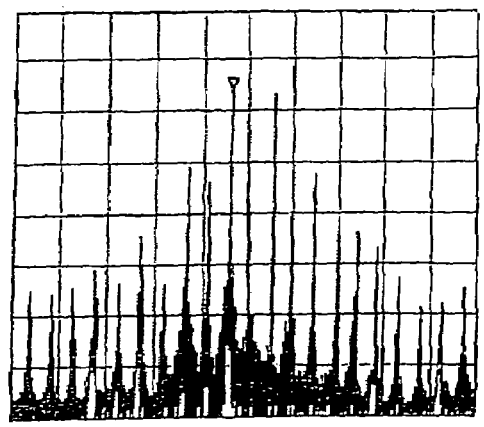

[FIG. 4]
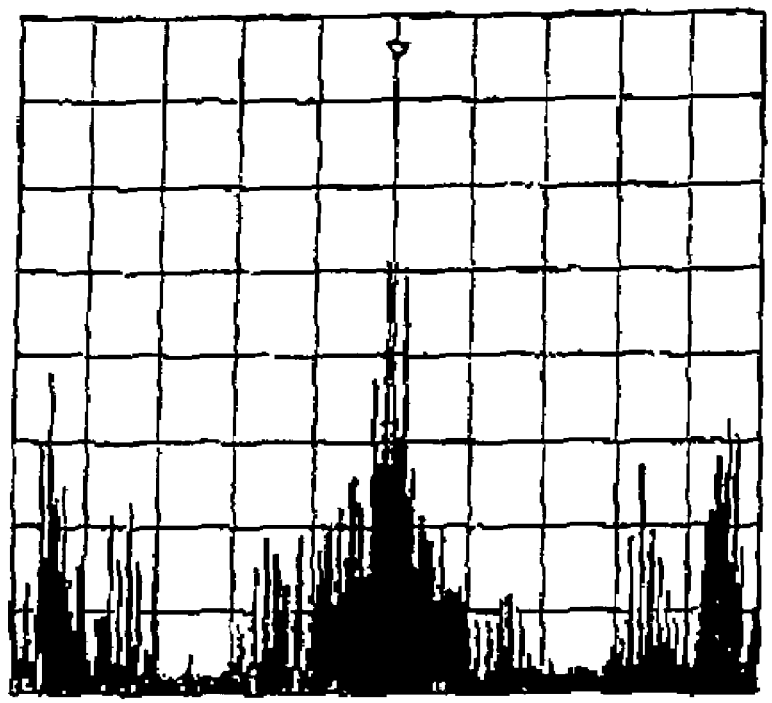
[FIG. 5]
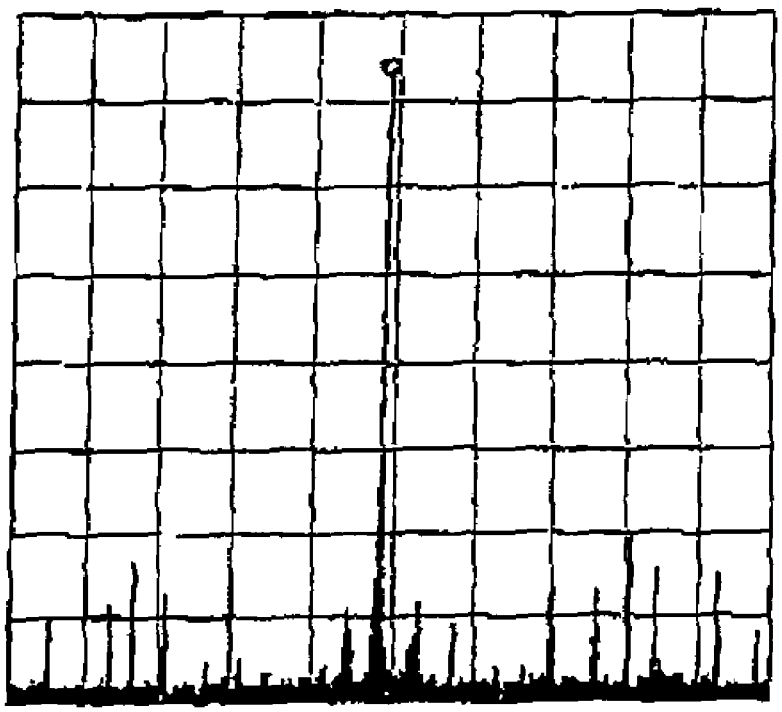

OSCILLATOR ARRAY, AND SYNCHRONIZATION METHOD OF THE SAME

TECHNICAL FIELD

The present invention relates to an oscillator array for performing a microwave power transmission, as in a phased antenna array, and a synchronization method thereof.

BACKGROUND ART

A simplified oscillator array with a plurality of series-connected (arrayed) oscillators has been suggested (e.g. refer to patent documents 1 to 3). In this case, it is expected to be a power transmission unit of a high efficiency without a distribution loss, and it is also possible to reduce a scale of the apparatus in the microwave power transmission.

Patent document 1: Japanese Patent Application Laid Open NO. 2002-299943 (Claim 1)
Patent document 2: Japanese Patent Application Laid Open NO. 2003-133952 (Claim 1)
Patent document 3: Japanese Patent Application Laid Open NO. 2003-258556 (Claim 1)

DISCLOSURE OF INVENTION

Subject to be Solved by the Invention

However, in order to array the plurality of oscillators, it is necessary to stabilize the oscillating frequency of each oscillator, and also synchronize the plurality of oscillators.

It is therefore an object of the present invention to provide an oscillator array and a synchronization method thereof, which can stabilize the oscillating frequency of each oscillator, and also synchronize the plurality of oscillators.

Means for Solving the Subject

An oscillator array of the present invention is provided with: a plurality of series-connected oscillators; and at least one band elimination filter which is disposed between respective adjacent two of the oscillators.

A synchronization of the oscillator array of the present invention is a synchronization method of an oscillator array provided with: a plurality of series-connected oscillators; and at least one band elimination filter which is disposed between respective adjacent two of the oscillators, wherein signal generated from each of the oscillators is in phase with signal reflected by corresponding band elimination filter at elimination frequencies of the band filter, and is in opposite phase with signal leaked from corresponding band elimination filter, by which stable oscillation is performed, with oscillation frequency of the oscillator balanced with optimum frequency between natural frequency of the oscillator and the elimination frequencies of the band elimination filter, while the oscillators are synchronized by using the elimination frequencies as reference frequencies.

Advantageous Effect of the Invention

According to the present invention, in synchronizing an oscillator array provided with: a plurality of series-connected oscillators; and at least one band elimination filter which is disposed between respective adjacent two of the oscillators, signals generated from the oscillators are in phase with signals reflected by the corresponding band elimination filters at the elimination frequencies of the band filters (i.e. a phase difference is 0 degree between the signals generated from the oscillators and the signals reflected). At the same time, they are in opposite phase with signals leaked from the corresponding band elimination filters (i.e. a phase difference is 180 degrees between the signals generated from the oscillators and the signals reflected). By this, stable oscillation can be performed, with the oscillation frequencies of the oscillators balanced with optimum frequencies between the natural frequencies of the oscillators and the elimination frequencies of the band elimination filters, while the oscillators can be synchronized by using the elimination frequencies as reference frequencies.

Preferably, another band elimination filter is disposed between the oscillator and the band elimination filter, and a resistance is disposed between a ground point and a point between the band elimination filter and the another band elimination filter.

BRIEF DESCRIPTION OF DRAWINGS

[FIG. 1] FIG. 1 is a block diagram showing an oscillator array in a first embodiment of the present invention.

[FIG. 2] FIG. 2 is a conceptual view showing an oscillator array in a second embodiment of the present invention.

[FIG. 3] FIG. 3 is a diagram showing the measurement result of the oscillation condition of a conventional oscillator array.

[FIG. 4] FIG. 4 is a diagram showing the measurement result of the oscillation condition of the oscillator array of the present invention.

[FIG. 5] FIG. 5 is a diagram showing another measurement result of the oscillation condition of the oscillator array of the present invention.

| Description of Reference Codes | |
|---|---|
| 1-1, 1-2, . . . , 1-n | oscillator (OSC) |
| 2-1, 2-2, . . . , 2-n | antenna |
| 3-1, 3-2, . . . , 3-n | band elimination filter (BEF) |
| 11-1, 11-2, 11-3, 11-4 | open stub |
| 12-1, 12-2, 12-3 | port |
| 13-1, 13-2 | terminating resistance |

BEST MODE FOR CARRYING OUT THE INVENTION

Embodiments of the oscillator array and the synchronization method thereof of the present invention will be explained in detail, with reference to the drawings.

FIG. 1 is a conceptual view showing an oscillator array in a first embodiment of the present invention. This oscillator array is provided with: n series-connected oscillators (OSC) 1-1, 1-2, . . . , 1-n; antennas 2-1, 2-2, . . . , 2-n respectively connected to the oscillators 1-1, 1-2, . . , 1-n; and band elimination filters (BEF) 3-1, 3-2, . . . , 3-n each of which is located between respective adjacent two of the oscillators 1-1, 1-2, . . . , 1-n. Incidentally, n is a natural number of 2 or more.

In the embodiment, the oscillator shall be a Colpitts oscillator, the antenna shall be a microstrip antenna, and the band elimination filter shall be a stub, for example.

The operation of the embodiment will be discussed. High-frequency signals outputted from the oscillators 1-1, 1-2, . . . , 1-n are transmitted to the band elimination filters 3-1, 3-2, . . . , 3-n adjacent to the oscillators 1-1, 1-2, . . . , 1-n, respectively. The band elimination filters 3-1, 3-2, . . . , 3-n reflect most of the high-frequency signals at their elimination frequencies, and return the most of the high-frequency signals to the oscillators 1-1, 1-2, . . . , 1-n as the output sources, respectively. At this time, at each of the output terminals of the oscillators 1-1, 1-2, . . . , 1-n, there is a phase difference of 0 degree between the high-frequency signals outputted from the oscillators 1-1, 1-2, . . . , 1-n and the signals reflected by the band elimination filters 3-1, 3-2, . . . , 3-n, respectively.

A small amount of the high-frequency signals transmitted to the band elimination filters 3-1, 3-2, . . . , 3-n, are leaked into the adjacent band elimination filters 3-1, 3-2, . . . , 3-n, or the like. At this time, at each of the output terminals of the oscillators 1-1, 1-2, . . . , 1-n, there is a phase difference of 180 degrees between the high-frequency signals outputted from the oscillators 1-1, 1-2, . . . , 1-n and the signals leaked into the respective band elimination filters 3-1, 3-2, . . . , 3-n, respectively.

According to the embodiment, in synchronizing the oscillator array, the signals generated from the oscillators 1-1, 1-2, . . . , 1-n are in phase with the signals reflected by the corresponding band elimination filters 3-1, 3-2, . . . , 3-n, respectively, at the elimination frequencies of the band filters 3-1, 3-2, . . . , 3-n (i.e. a phase difference is 0 degree between the signals generated from each of the oscillators 1-1, 1-2, . . . , 1-n and the reflected signals). At the same time, the signals generated from the oscillators 1-1, 1-2, . . . , 1-n are in opposite phase with the signals leaked from the corresponding band elimination filters 3-1, 3-2, . . . , 3-n, respectively (i.e. a phase difference is 180 degrees between the signals generated from each of the oscillators 1-1, 1-2, . . . , 1-n and the reflected signals). As a result, stable oscillation can be performed, with the oscillation frequencies of the oscillators 1-1, 1-2, . . . , 1-n balanced with optimum frequencies between the natural frequencies of the oscillators and the elimination frequencies of the band elimination filters respectively, while the oscillators can be synchronized by using the elimination frequencies as reference frequencies.

FIG. 2 is a conceptual view showing an oscillator array in a second embodiment of the present invention. In the embodiment, the band elimination filters shall be open stubs 11-1 to 11-4 using micro strip lines. Not-illustrated oscillators connected to not-illustrated antennas are connected to ports 12-1 to 12-3, respectively. There are provided terminating resistances 13-1 and 13-2. One end of each of the terminating resistances 13-1 and 13-2 is connected to between the oscillators, and the other end of each of the terminating resistances 13-1 and 13-2 is grounded.

Explaining the embodiment in more detail between the ports 12-1 and 12-2, if the wavelength of a predetermined frequency is λ, distance between the ports 12-1 and 12-2 is set to λ, and the terminating resistance 13-1 is disposed in the middle of the ports 12-1 and 12-2 for phase adjustment.

The synchronization operation is as follows, in the case in which there are provided: the not-illustrated series-connected oscillators; the open stubs 11-1 and 11-3 each of which is located between respective adjacent two of the oscillators; the other open stub 11-2 located between the not-illustrated oscillator and the open stub 11-1; the other open stub 11-4 located between the not-illustrated oscillator and the open stub 11-3; the terminating resistance 13-1 located between the ground point and a point between the open stubs 11-1 and 11-2; and the terminating resistance 13-2 located between the ground point and a point between the open stubs 11-3 and 11-4.

(1) Since the oscillating frequency of each oscillator and the elimination frequencies of the open stubs 11-1 to 11-4 do not match completely, the oscillating frequency switches so as to balance between the both frequencies.

(2) A slight leakage signal transmitted through the stub related to a difference between the oscillating frequency of each oscillator and the open stubs 11-1 to 11-4 is supplied to the adjacent oscillator.

(3) The frequency and the phase of each oscillator are controlled by each other, due to the leakage signal.

(4) The frequency transits to a point where the reflection amount of returning to the oscillator itself from the open stubs 11-1 to 11-4 and the amount of leaking into the adjacent oscillator are balanced, and is stabilized at the point.

(4) The phase transits to a state in which the phase is reversed with respect to that of the adjacent oscillator.

In particular, the signal of the oscillator itself is reflected by the open stubs 11-1 to 11-4, to thereby give positive feedback to the oscillator, so that it maintains a certain free-running oscillation condition.

Now, the oscillation condition in the embodiment is explained in comparison with the oscillation condition of a conventional oscillator array, i.e. the oscillator array in which the open stubs 11-1 to 11-4 and the terminating resistances 13-1 and 13-2 are omitted in the oscillator array in FIG. 2.

FIG. 3 is a diagram showing the measurement result of the oscillation condition of the conventional oscillator array. FIG. 4 is a diagram showing the measurement result of the oscillation condition if the terminating resistances are 50Ω in the oscillator array in FIG. 2. FIG. 5 is a diagram showing the measurement result of the oscillation condition if the terminating resistances are 500Ω in the oscillator array in FIG. 2.

FIG. 3 shows that it is not in the synchronization condition because there is no reflection of the signal outputted from each oscillator from the open stub, and the leakage from the open stub increases and the free-running oscillation is unstable, resulting in many image frequencies.

In contrast, FIG. 4 shows that the synchronization condition is maintained in which the output is about 10 dB larger than that in FIG. 3. Moreover, FIG. 5 shows that the better synchronization condition is maintained because the leakage amount from the open stub increases more than in the case of FIG. 4.

The above-mentioned first and second embodiments have the following advantages.

(1) The oscillation frequencies of all the oscillators are determined on the basis of the line length between adjacent two of the oscillators and the characteristics of the band elimination filters, and they are synchronized as a whole, so that it is possible to easily synchronize the plurality of oscillators.

(2) The promoting action of the free-running oscillation and the promoting action of synchronization by the oscillators are provided, so that it is possible to realize the synchronization mechanism mutually promoted by an individual oscillator.

(3) The oscillation frequencies of all the oscillators are determined on the basis of the line length between adjacent two of the oscillators and the characteristics of the band elimination filters, and all the oscillators operate and are synchronized to be balanced with the elimination frequencies of the band elimination filters without injecting a reference signal. Thus, it is possible to easily synchronize the plurality of oscillators without a need for an additional apparatus, such as a reference generator.

(4) The promoting action of the free-running oscillation and the promoting action of synchronization by the oscillators are provided, and there is high frequency stability with respect to disturbance and a change in supply voltage. Thus, it is possible to easily realize the oscillator with high frequency stability, at low cost.

The present invention is not limited to the above-mentioned embodiments, and various changes and modifications can be made.

For example, in the above-mentioned first embodiment, it is possible to provide an arbitrary number of oscillators and set the number of the band elimination filters to the number reduced by 1 from the number of the oscillators. Moreover, in the above-mentioned second embodiment, it is possible to provide an arbitrary number of oscillators, and set the number of the band elimination filters to a double of the number reduced by 1 from the number of the oscillators, and set the number of the resistances to the number reduced by 1 from the number of the oscillators.

Furthermore, an oscillator of an arbitrary type other than the Colpitts oscillator can be used as the oscillator. An antenna of an arbitrary type other than the microstrip antenna can be used as the antenna. A band elimination filter of an arbitrary type other than the (open) stub can be used as the band elimination filter.

INDUSTRIAL APPLICABILITY

The oscillator array and the synchronization method thereof in the present invention can be applied as a transmission unit of a high efficiency without a distribution loss, and also applied to an oscillator array for performing a microwave power transmission, as in a phased antenna array, and a synchronization method thereof.

The invention claimed is:

1. An oscillator array comprising:
   a plurality of series connected oscillators; and
   at least one band elimination filter which is disposed between respective adjacent two of said oscillators,
   wherein said at least one band elimination filter, at an elimination frequency of said at least one band elimination filter,
   (i) reflects a portion of a signal generated from a corresponding said oscillator to the corresponding said oscillator in phase, and
   (ii) leaks another portion of the signal generated from the corresponding oscillator in opposite phase.

2. An oscillator array comprising:
   a plurality of series connected oscillators; and
   a first band elimination filter which is disposed between respective adjacent two of said oscillators,
   a second band elimination filter disposed between one of said adjacent two oscillators and said first band elimination filter, and
   a resistance disposed between a ground point and a point between said first band elimination filter and said second band elimination filter.

3. A synchronization method of an oscillator array comprising:
   a plurality of series connected oscillators; and
   at least one band elimination filter which is disposed between respective adjacent two of said oscillators,
   wherein a signal generated from each of said oscillators is in phase with a signal reflected by a corresponding band elimination filter at elimination frequencies of said band elimination filter, and is in opposite phase with a signal leaked from a corresponding band elimination filter, by which stable oscillation is performed, with oscillation frequency of said oscillator balanced with optimum frequency between natural frequency of said oscillator and the elimination frequencies of said band elimination filter, while said oscillators are synchronized by using the elimination frequencies as reference frequencies.

* * * * *